United States Patent
Ma et al.

(10) Patent No.: US 9,819,339 B2
(45) Date of Patent: Nov. 14, 2017

(54) METHOD AND CIRCUIT FOR REDUCING COLLECTOR-EMITTER VOLTAGE OVERSHOOT IN AN INSULATED GATE BIPOLAR TRANSISTOR

(71) Applicant: Infineon Technologies Austria AG, Villach (AT)

(72) Inventors: Kwok Wai Ma, Hong Kong (HK); Sui Pung Cheung, Hong Kong (HK)

(73) Assignee: Infineon Technologies Austria AG, Villach (AT)

( * ) Notice: Subject to any disclaimer, the term of this patent is extended or adjusted under 35 U.S.C. 154(b) by 91 days.

(21) Appl. No.: 14/710,989

(22) Filed: May 13, 2015

(65) Prior Publication Data

US 2016/0336936 A1    Nov. 17, 2016

(51) Int. Cl.
   *H03K 17/04*    (2006.01)
   *H03K 17/16*    (2006.01)
   *H03K 17/081*   (2006.01)

(52) U.S. Cl.
   CPC ....... *H03K 17/168* (2013.01); *H03K 17/0406* (2013.01); *H03K 17/08116* (2013.01)

(58) Field of Classification Search
   CPC ......... H02M 1/42; H03K 17/082; H03K 3/57; H03K 17/0412; H03K 17/168; H03K 17/302; H03K 17/687; H03K 17/0406; H03K 17/08116; H03K 17/0828
   USPC ........................................ 327/365, 374, 377
   See application file for complete search history.

(56) References Cited

U.S. PATENT DOCUMENTS

| | | | |
|---|---|---|---|
| 8,836,042 B2* | 9/2014 | Ueno | F02P 3/051 123/605 |
| 9,007,102 B2* | 4/2015 | Lobsiger | H03K 17/00 327/109 |
| 2005/0040434 A1 | 2/2005 | Hornkamp et al. | |

FOREIGN PATENT DOCUMENTS

EP        1493229 B1        6/2007

OTHER PUBLICATIONS

Helsper, Martin, "Treiberseitige Steuerung der Strom-und Spannungsgradienten an schnell schaltenden IGBTs bei Schaltvorgängen", Symposium Maritime Elektronik.
Huang, Frank et al., "IGBT Fault Protection Based on di-dt Feedback Control", PESC 2007, pp. 1478-1484.
(Continued)

*Primary Examiner* — Lincoln Donovan
*Assistant Examiner* — Diana J Cheng
(74) *Attorney, Agent, or Firm* — Murphy, Bilak & Homiller, PLLC

(57)   ABSTRACT

A circuit for reducing collector-emitter voltage ($V_{CE}$) overshoot in an insulated gate bipolar transistor (IGBT) is provided. The circuit includes circuitry operable to generate a pulse which has a rising edge synchronized to the moment when collector or emitter current of the IGBT begins to fall during turn-off of the IGBT and a width which is a fraction of a duration of the $V_{CE}$ overshoot. The circuitry is further operable to combine the pulse with a control signal applied to a gate of the IGBT so as to momentarily raise the gate voltage of the IGBT during turn-off of the IGBT to above a threshold voltage of the IGBT for the duration of the pulse. A corresponding method of reducing $V_{CE}$ overshoot in an IGBT also is provided.

21 Claims, 15 Drawing Sheets

(56) References Cited

OTHER PUBLICATIONS

Oinonen, Markus et al., "Current measurement and short-circuit protection of an IGBT based on module parasitics", EPE 2014.
Wang, Zhiqiang et al., "A di-dt Feedback-Based Active Gate Driver for Smart Switching and Fast Overcurrent Protection of IGBT Modules", IEEE Transactions on Power Electronics, vol. 29, No. 7, Jul. 2014, pp. 3720-3732.
Chen, et al., "Closed-Loop Gate Drive for High Power IGBTs", APEC 2009, pp. 1331-1337.
Idir, et al., "Active Gate Voltage Control of Turn-on di/dt and Turn-off dv/dt in Insulated Gate Transistors", IEEE Transactions on Power Electronics, Jul. 2006, pp. 849-855.
Lobsiger, et al., "Closed-Loop IGBT Gate Drive Featuring Highly Dynamic di/dt and dv/dt Control", ECCE 2012, pp. 4754-4761.
Luniewski, et al., "Dynamic Voltage Rise Control, the Most Efficient Way to Control Turn-off Switching Behaviour of IGBT Transistors", Pelincec 2005, Warschau.

\* cited by examiner

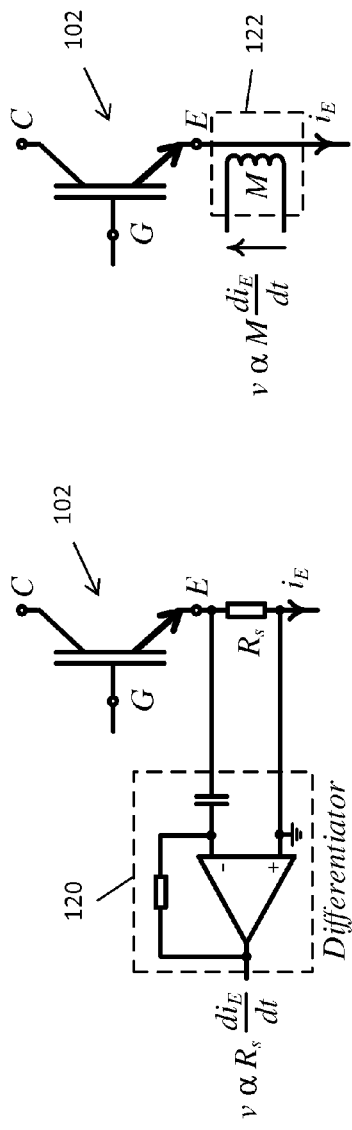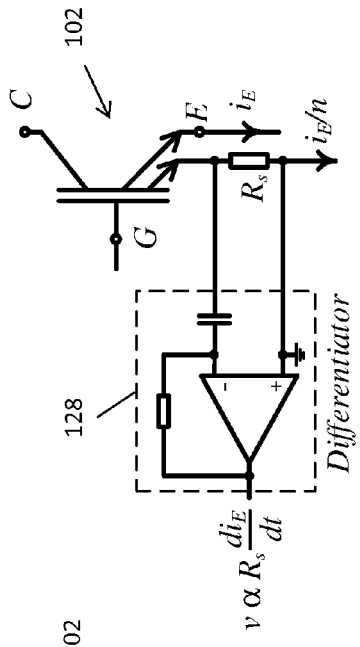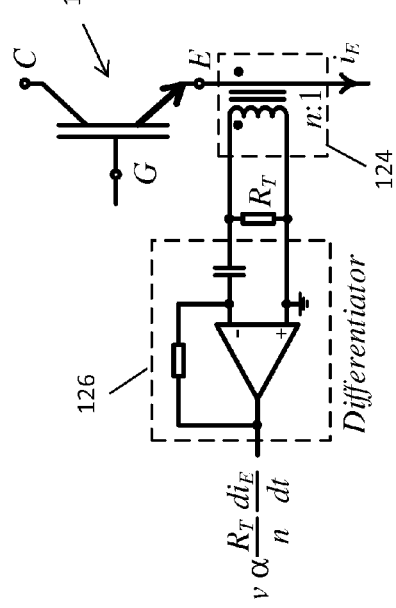
Figure 4(a) (a) Shunt resistor
Figure 4(b) (b) Rogowski coil
Figure 4(c) (c) Current transformer
Figure 4(d) (d) Current-Sense IGBT Sense-emitter shunt

METHOD AND CIRCUIT FOR REDUCING COLLECTOR-EMITTER VOLTAGE OVERSHOOT IN AN INSULATED GATE BIPOLAR TRANSISTOR

TECHNICAL FIELD

The present application relates to insulated gate bipolar transistors (IGBTs), in particular reducing collector-emitter voltage overshoot in IGBTs.

BACKGROUND

During turn-off of an IGBT, the voltage ($V_{CE}$) across the collector (C) and emitter (E) terminals of the IGBT often overshoots beyond its nominal value. Such $V_{CE}$ turn-off overshoot reduces the safety margin of IGBT operation and can lead to immediate destruction of the IGBT once the maximum $V_{CE}$ breakdown voltage rating is exceeded. A key factor in reducing the $V_{CE}$ turn-off overshoot is reducing the time rate of rise ($di_C/dt$) of the collector current $I_C$ during turn-off. However, $di_C/dt$ during turn-off is difficult to control. This is particularly true for trench-gate IGBTs in which the insulated gate is disposed in a trench formed in a semiconductor material such as Silicon. Trench-gate IGBTs have significantly higher internal capacitance compared to planar-gate IGBTs. This internal capacitance stores charges during turn on of the IGBT, and these charges must be removed during turn off of the IGBT. The high internal capacitance of the IGBT makes it more difficult to control IGBT turn off, and therefore more difficult to reduce $V_{CE}$ overshoot without significantly reducing efficiency.

There are five main approaches to reduce $V_{CE}$ turn-off overshoot for trench-gate IGBT. In a first approach, the turn-off gate resistor $R_{GOFF}$ is increased. This approach uses a higher gate resistor during the IGBT turn-off process. One disadvantage of this approach is the entire turn-off process is slowed down, leading to significant increase in turn-off loss $E_{OFF}$.

In a second approach, the turn-off gate voltage is adjustable. This approach uses a different gate voltage below the threshold voltage to reduce the discharge rate of the gate during turn-off. One disadvantage of this approach is the entire whole switching process is slowed down, leading to significantly increased turn-off loss $E_{OFF}$.

In a third approach, active voltage clamping is used. This approach use collector voltage feedback to turn-on the gate momentarily when $V_{CE}$ exceeds a predefined level during the turn-off process. One disadvantage of this approach is voltage feedback from the collector of the IGBT is needed, which leads to reliability problems for high-voltage IGBT applications. In addition, this approach does not control or reduce turn-off $dI_C/dt$.

In a fourth approach, dynamic voltage rise control (DVRC) is used. DVRC uses one or more capacitors to sense the collector voltage and uses the sensed signal to turn-on the gate momentarily when $dV_{CE}/dt$ exceeds a predefined level during the turn-off process. One disadvantage of this approach is voltage feedback from the collector of IGBT is needed, which leads to reliability problems for high-voltage IGBT applications.

In a fifth approach, di/dt control is implemented by emitter inductance voltage feedback. This approach utilize the emitter stray inductance to generate the $di_E/dt$ voltage signal, which is added to the gate voltage and functions as negative feedback to the gate voltage when $I_E$ is falling. A Zener diode and/or resistor network may be added to clamp or adjust the feedback voltage. This approach is useful in reducing $V_{CE}$ overvoltage after short-circuit, when very high current has to be turned-off with high $di_E/dt$, by substantially reducing the turn-off $di_E/dt$ achieved with high gain in the feedback loop, at the expense of increase turn-off time and thus turn-off loss $E_{OFF}$. When using this technique to reduce turn-off $V_{CE}$ overshoot during normal operation, since the feedback action is active throughout the current fall time $t_F$ (voltage overshoot period), it will increase the fall time $t_F$ and $E_{OFF}$ quite significantly, which is often not acceptable for normal operation.

SUMMARY

According to an embodiment of a circuit, the circuit comprises an insulated gate bipolar transistor (IGBT) operable to conduct current in a first phase of a switching cycle and block current in a second phase of the switching cycle responsive to a control signal applied to the gate of the IGBT, wherein overshoot occurs in the collector-emitter voltage ($V_{CE}$) of the IGBT in the second phase of the switching cycle. The circuit further comprises circuitry operable to generate a pulse which has a rising edge synchronized to the moment when current through the IGBT begins to fall in the second phase of the switching cycle and a width which is a fraction of a duration of the $V_{CE}$ overshoot. The circuitry is further operable to combine the pulse with the control signal applied to a gate of the IGBT so as to momentarily raise the gate voltage of the IGBT in the second phase of the switching cycle to above a threshold voltage of the IGBT for the duration of the pulse.

According to an embodiment of a method of reducing overshoot for an IGBT operable to conduct current in a first phase of a switching cycle and block current in a second phase of the switching cycle responsive to a control signal applied to the gate of the IGBT, the overshoot occurring in the collector-emitter voltage ($V_{CE}$) of the IGBT in the second phase of the switching cycle, the method comprises: generating a pulse which has a rising edge synchronized to the moment when current through the IGBT begins to fall in the second phase of the switching cycle and a width which is a fraction of a duration of the $V_{CE}$ overshoot; and combining the pulse with the control signal applied to a gate of the IGBT so as to momentarily raise the gate voltage of the IGBT in the second phase of the switching cycle to above a threshold voltage of the IGBT for the duration of the pulse.

According to an embodiment of a circuit for reducing collector-emitter voltage ($V_{CE}$) overshoot in an IGBT, the circuit comprising circuitry operable to: generate a pulse which has a rising edge synchronized to the moment when collector or emitter current of the IGBT begins to fall during turn-off of the IGBT and a width which is a fraction of a duration of the $V_{CE}$ overshoot; and combine the pulse with a control signal applied to a gate of the IGBT so as to momentarily raise the gate voltage of the IGBT during turn-off of the IGBT to above a threshold voltage of the IGBT for the duration of the pulse.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4(a) through 4(d) illustrate schematics of different analog embodiments of current sensing and time differentiation circuitry used in reducing $V_{CE}$ overshoot of an IGBT.

DETAILED DESCRIPTION

Embodiments described herein reduce IGBT collector-emitter voltage ($V_{CE}$) turn-off overshoot by controlling and reducing turn-off $di_C/dt$ or $diE/dt$ for normal operation and short-circuit operation, realized by using a short $V_{GE}$ control pulse also referred to herein as '$di_E/dt$ control pulse' or '$di_E/dt$ control' applied to the IGBT gate during turn-off. The gate voltage of the IGBT is pulled up above the gate threshold voltage $V_{TH}$ by this pulse, so that the IGBT momentarily turns on again during the turn-off period, reducing $di_E/dt$ and thus the $V_{CE}$ overshoot voltage peak.

Figure 1:
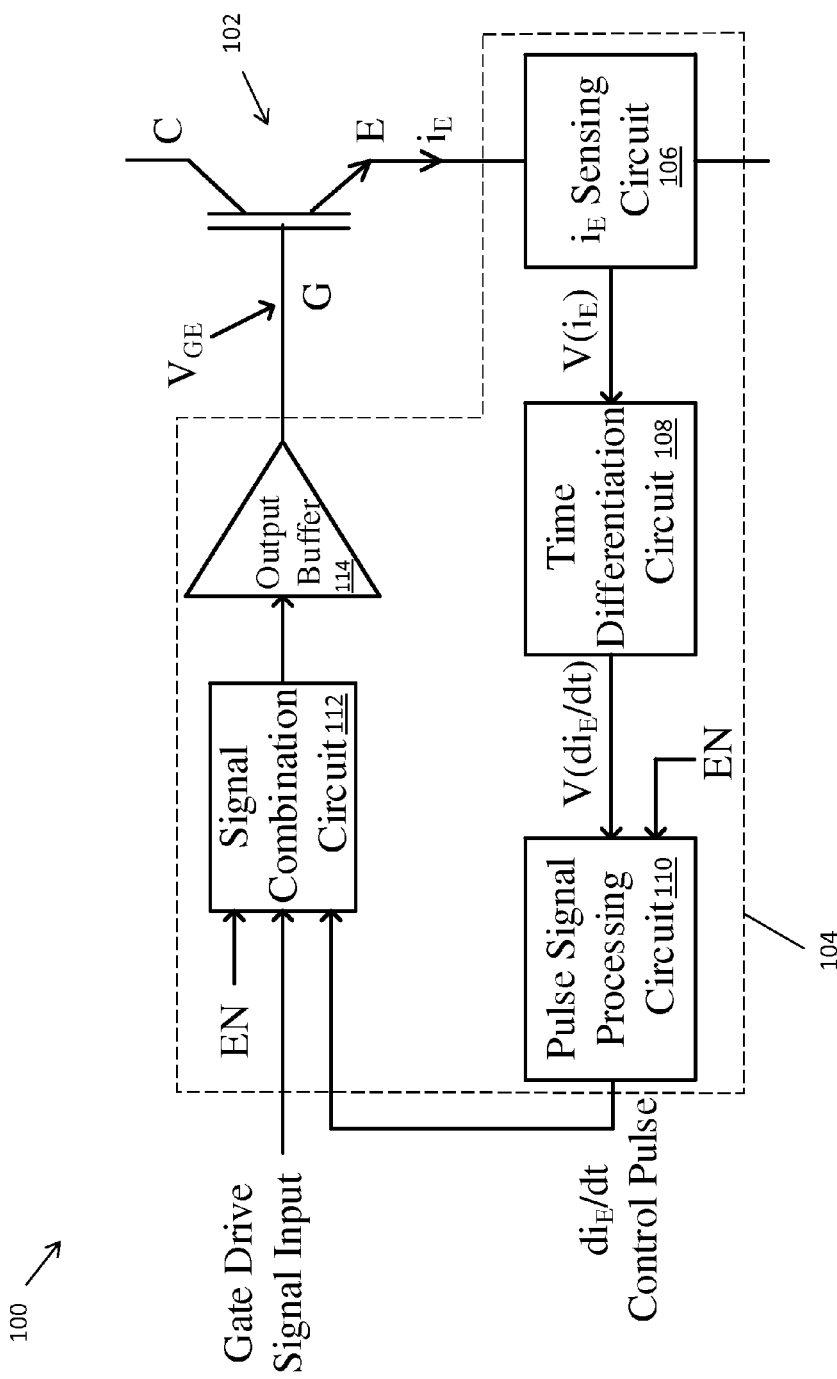
FIG. 1 illustrates a block diagram of an embodiment of a circuit which includes an IGBT and circuitry for reducing $V_{CE}$ overshoot of the IGBT.
Figure 2:
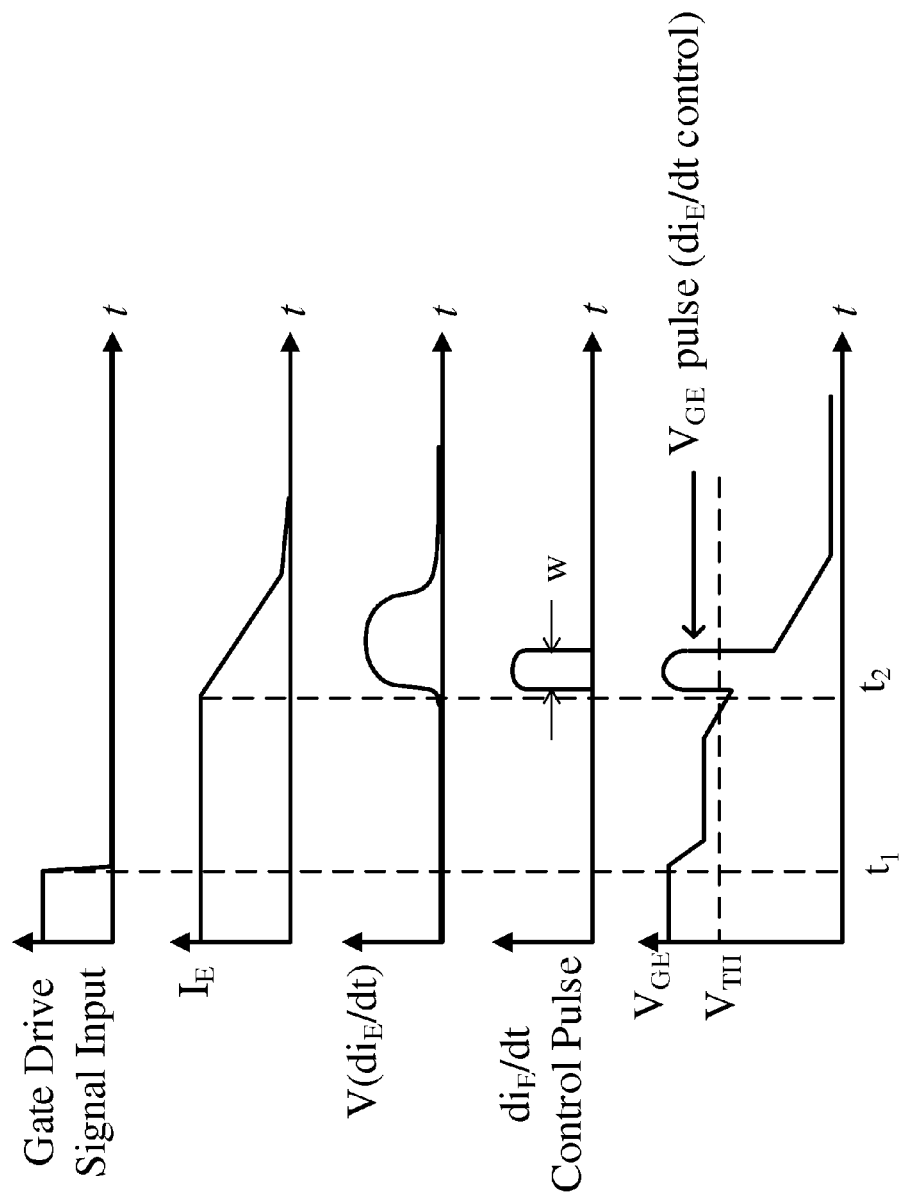
FIG. 2 illustrates a timing diagram associated with operation of the circuit shown in FIG. 1.

FIG. 1 illustrates an embodiment of a circuit 100 which includes an IGBT 102 and circuitry 104 for reducing $V_{CE}$ overshoot of the IGBT 102, and FIG. 2 illustrates a timing diagram associated with operation of the circuit 100. In one embodiment, the IGBT 102 is a trench-gate IGBT in which the insulated gate of the IGBT 102 is disposed in a trench formed in a semiconductor material such as Silicon. Alternatively, the IGBT 102 can be a planar-gate IGBT in which the insulated gate is disposed on the surface of the semiconductor material. Both types of IGBTs are well known in the semiconductor arts, and therefore no further description of the IGBT construction is given herein.

The IGBT 102 conducts current ($i_C/i_E$) in a first (turn-on) phase of a switching cycle and blocks current in a second (turn-off) phase of the switching cycle responsive to a control signal ($V_{GE}$) applied to the gate (G) of the IGBT 102. During turn-off of the IGBT 102, the voltage $V(di_E/dt)$ across the collector (C) and emitter (E) terminals often overshoots beyond its nominal value. If left unmitigated, the $V_{CE}$ turn-off overshoot can reduce the safety margin of IGBT operation or even lead to immediate destruction of the IGBT 102 if the overshoot exceeds the maximum $V_{CE}$ breakdown voltage rating of the IGBT 102.

The circuitry 104 implements optimal control of the turn-off $di_E/dt/di_C/dt$ and reduction of the $V_{CE}$ overshoot to mitigate the adverse effects associated with the overshoot. The circuitry 104 forces the IGBT 102 to turn-on again immediately and momentarily when $i_E/i_C$ begins to fall. This mean that the $V_{GE}$ control pulse is generated by the circuitry 104 when the emitter current $i_E$ or collector current $i_C$ just starts to fall, i.e. when $di_E/dt/di_C/dt$ is increased from zero, which is around time $t_2$ in FIG. 2. To this end, the circuitry 104 generates a $di_E/dt$ control pulse which has a rising edge synchronized to the moment when current ($i_C$ or $i_E$, either of which can be sensed) through the IGBT 102 begins to fall in the second (turn-off) phase of the switching cycle. The width (w) of the $di_E/dt$ control pulse is a fraction of the duration of the $V_{CE}$ overshoot. In one embodiment, the width of the $di_E/dt$ control pulse is between ½ and ¼ the duration of the $V_{CE}$ overshoot.

The circuitry 104 combines the $di_E/dt$ control pulse with the control signal (labeled 'gate drive signal input' in FIGS. 1 and 2) applied to the gate of the IGBT 102, so as to momentarily raise the gate voltage $V_{GE}$ of the IGBT 102 in the second (turn-off) phase of the switching cycle to above a threshold voltage ($V_{TH}$) of the IGBT 102 for the duration of the pulse as shown in FIG. 2.

More particularly, the circuitry 104 senses the emitter current $i_E$ or collector current $i_C$ and processes the sensed current signal $i_E/i_C$ to give a signal $V(di_E/dt)$ which represents the time-differentiation of the current $i_E/i_C$. The time differentiation signal $V(di_E/dt)$ has the shape of a voltage pulse with its rising edge synchronized with the moment when $i_E/i_C$ just begins to fall as shown in FIG. 2. To achieve the optimal control result, the delay time of the synchronization is minimized. Delay time can be minimized by increasing the gain of the pulse signal processing circuit 110. The time differentiation signal $V(di_E/dt)$ triggers the circuitry 104 to generate the short pulse $di_E/dt$ control pulse for turning on the IGBT 102 for a short duration, in order to control and reduce turn-off $di_E/dt$ and reduce $V_{CE}$ overshoot.

A trade-off exists regarding the choice of the pulse width (time duration) of the $di_E/dt$ control pulse. A longer pulse width (w) increases turn-off energy loss $E_{OFF}$ and can even lead to oscillation, while a shorter pulse width can result in insufficient reduction of turn-off $di_E/dt$ and $V_{CE}$ overshoot. The optimal pulse width is a function of the IGBT intrinsic turn-off fall time and therefore is longer for high-voltage IGBTs or IGBTs with soft-turn off characteristics. The optimal pulse width also is a function of the stray inductance of the commutation path. The width of the $di_E/dt$ control pulse can be fixed or programmable, to optimize according to specific application requirements, and is limited to a fraction, e.g. ½ to ¼, etc. of the $V_{CE}$ voltage overshoot duration. The amplitude of the $di_E/dt$ control pulse also can be fixed or programmable. For example, the amplitude of the $di_E/dt$ control pulse can be controlled by amplitude gain and time-constant settings of the circuitry 104. These parameters can be set by the user.

To achieve optimal performance, the circuitry 104 has fast response and minimal delay time in comparison to the duration of the $di_E/dt$ control pulse. Since the IGBT turn-off energy loss $E_{OFF}$ increases in the presence of the $di_E/dt$ control pulse, an enable (EN) function can be provided to allow the user to selectively activate/deactivate the turn-off $di_E/dt$ control pulse function. For example, when the DC link voltage of the IGBT 102 reaches a defined value beyond which normal turn-off of the IGBT gives dangerously high $V_{CE}$ voltage overshoot, the turn-off $di_E/dt$ control pulse function is activated.

In an embodiment, the circuitry 104 comprises a current sensing circuit 106 for sensing the current through the IGBT 102. Either the emitter current $i_E$ or collector current $i_C$ can be sensed. The circuitry 104 also comprises a time differentiation circuit 108 for processing the sensed current signal $i_E/i_C$ to generate a signal $V(di_E/dt)$ proportional to the time-differentiation of the sensed current $i_E/i_C$. The circuitry 104 further includes a pulse signal processing circuit 110 for processing the $V(di_E/dt)$ time differentiation signal, providing input protection and signal amplification with frequency compensation, and generating the $di_E/dt$ control pulse. The $di_E/dt$ control pulse is synchronized with the moment when $i_E/i_C$ begins to fall during turn-off of the IGBT 102 with minimal time delay. When the control pulse function is enabled, the $di_E/dt$ control pulse is used to turn-on the IGBT 102 momentarily when $i_E/i_C$ falls during IGBT turn-off. The width of the $di_E/dt$ control pulse can be fixed or user-controllable to allow for trade-off between reduction of turn-off $di_E/dt$ and $V_{CE}$ overshoot versus increased turn-off energy loss $E_{OFF}$, and is limited to a fraction, e.g. half, quarter, etc. of the $V_{CE}$ voltage overshoot duration.

The circuitry 104 also includes a signal combination circuit 112 for combining the $di_E/dt$ control pulse with the gate drive signal. The combined signal is sent to an output buffer stage 114 for driving the gate of the IGBT 102 such that the $di_E/dt$ control pulse momentarily pulls up the IGBT gate voltage $V_{GE}$ above the IGBT gate threshold voltage $V_{TH}$ and the IGBT turn-off $di_E/dt$ and $V_{CE}$ overshoot are controlled by the voltage level and pulse duration (width) of the $di_E/dt$ control pulse. The circuitry 104 also has an enable function (EN) for selectively enabling or disabling the $di_E/dt$ control pulse function. In one embodiment, only the gate drive signal is sent directly to the output buffer 114 without the $di_E/dt$ control pulse, if the control signal EN indicates the $di_E/dt$ control pulse function is to be deactivated. The $di_E/dt$ control pulse is combined with the gate drive signal before sending to the output buffer 114, if the control signal EN indicates the $di_E/dt$ control pulse function is to be activated. The enable function can be implemented in the pulse signal processing circuit 110, to control the generation of the $di_E/dt$ control pulse, or in the signal combination circuit 112, to control the combination of the $di_E/dt$ control pulse with the gate drive signal. The EN signal should be activated to generate the $di_E/dt$ control pulse and combined with the gate drive signal, if the DC link voltage applied to the IGBT 102 exceeds a predetermined value.

Figure 3:
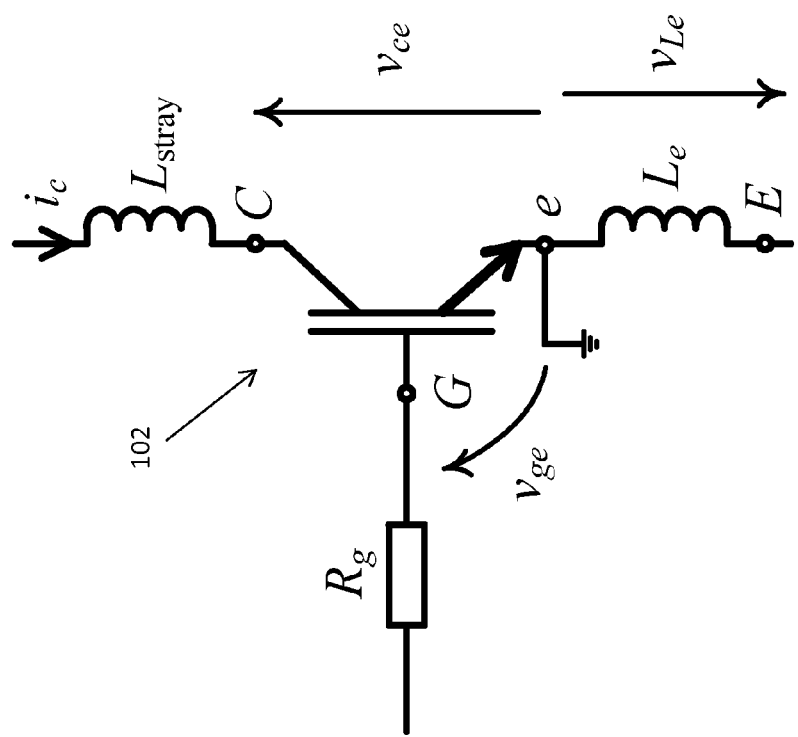
FIG. 3 illustrates a schematic of an analog embodiment of current sensing and time differentiation circuitry used in reducing $V_{CE}$ overshoot of an IGBT.

FIG. 3 shows an implementation embodiment for the current sensing circuit 106 and the time differentiation circuit 108. The stray emitter inductance $L_e$ at the main emitter terminal E of the IGBT 102 is used to perform the combined functions of emitter current $i_E$ sensing and generation of the signal $V(di_E/dt)$ which represents the time-differentiation of the emitter current $i_E$. The voltage $V_{Le}$ ($=L_e di_E/dt$) across the stray emitter inductance $L_e$ is proportional to $di_E/dt$ and therefore functions as the desired time differentiation signal $V(di_E/dt)$.

FIGS. 4(a) through 4(d) show four different embodiments of the current sensing and time differentiation circuits 106, 108 for generating the $V(di_E/dt)$ signal. The $V(di_E/dt)$ signal can be obtained by measuring the voltage across the emitter shunt resistor ($R_S$) and differentiating the voltage by an op-amp differentiator circuit 120 as shown in FIG. 4(a). Alternatively, the $V(di_E/dt)$ signal can be obtained by measuring the induced voltage output of a Rogowski coil 122 as shown in FIG. 4(b). In another embodiment, the $V(di_E/dt)$ signal can be obtained by using a current transformer (CT) 124 to couple the emitter current $i_E$ and differentiating the CT output voltage by an op-amp differentiator circuit 126 as shown in FIG. 4(c). In still another embodiment, the $V(di_E/dt)$ signal can be obtained by measuring the voltage across the current-sensing IGBT sense-emitter shunt resistor $R_S$ and differentiating the voltage by an op-amp differentiator circuit 128 as shown in FIG. 4(d).

When using the stray emitter inductance $L_e$ for $di_E/dt$ sensing to give the $V(di_E/dt)$ time differentiation signal as shown in FIGS. 3 and 4(a) through 4(d), a wide range of $V_{Le}$ signal voltage level is possible due to several factors such as the wide range of IGBT current rating $I_{CNOM}$, package stray collector-emitter inductance $L_{SCE}$ and turn-off current fall time $t_F$ of the IGBT 102. The composite parameter $L_{SCE}I_{CNOM}/(2t_F)$, which is a close proxy of the voltage $V_{Le}$, can range from 0.3V to 55V. The $V_{Le}$ signal voltage level also varies because the stray emitter inductance $L_e$ is not a controlled parameter and is subject to uncontrolled deviation e.g. ±30%, and the wide operation current range of the IGBT 102 from low-load, full load, overload to short circuit, at e.g. 0.1×, 1.0×, 2.0× and 6.0×$I_{CNOM}$ (nominal collector current), respectively.

Such a wide range of possible $V_{Le}$ signal voltage levels implies that, when the stray emitter inductance $L_e$ is used for $di_E/dt$ sensing, different pulse signal processing circuits should be used to fit the $L_{SCE}I_{CNOM}/(2t_F)$ characteristics of the IGBT 102, and each pulse signal processing circuit should be designed to handle an input signal with dynamic range of [0.07 . . . 2.6] and [0.07 . . . 7.8] of its nominal value for operation and short-circuit respectively, and be insensitive to $L_S$ parameter fluctuation.

Figure 5A:
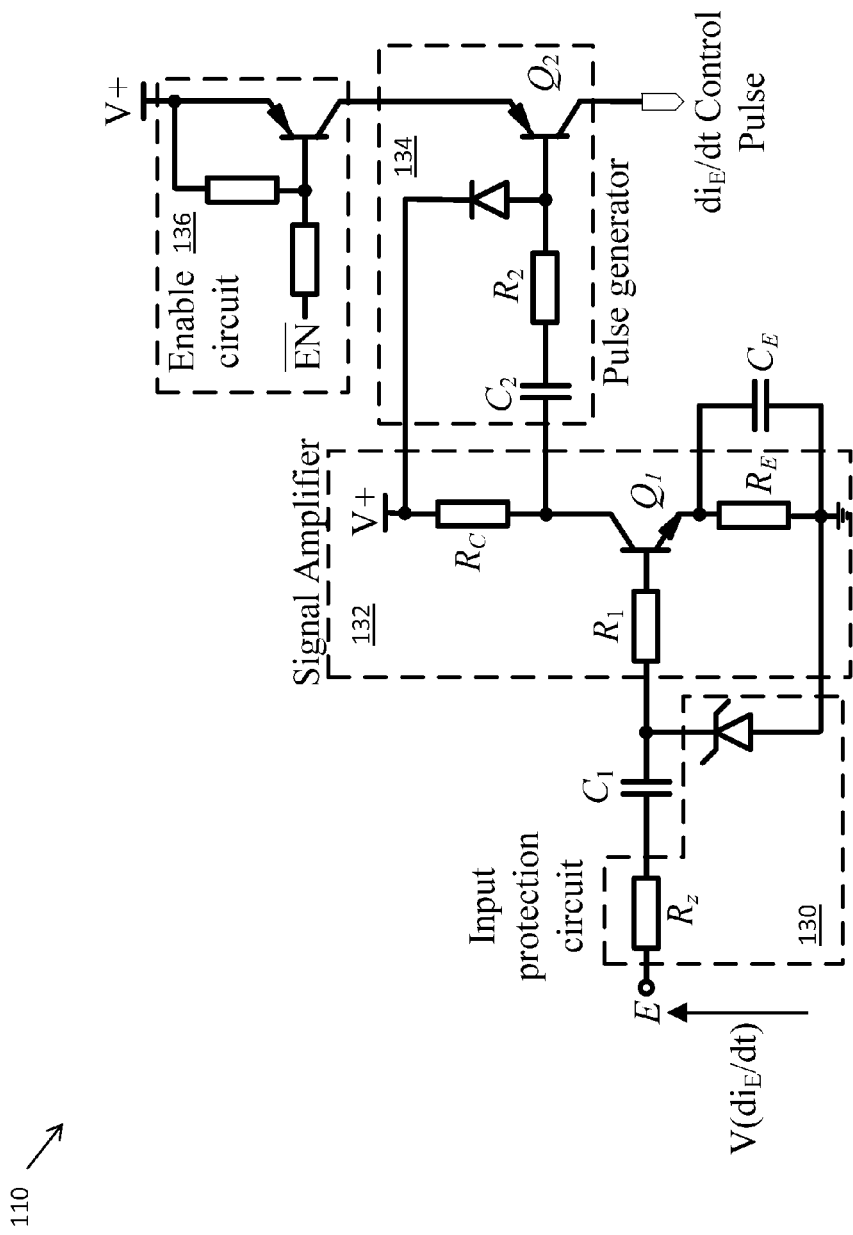
FIGS. 5(a) through 5(c) illustrate schematics of different analog embodiments of a pulse signal processing circuit used in reducing $V_{CE}$ overshoot of an IGBT.
Figure 5B:
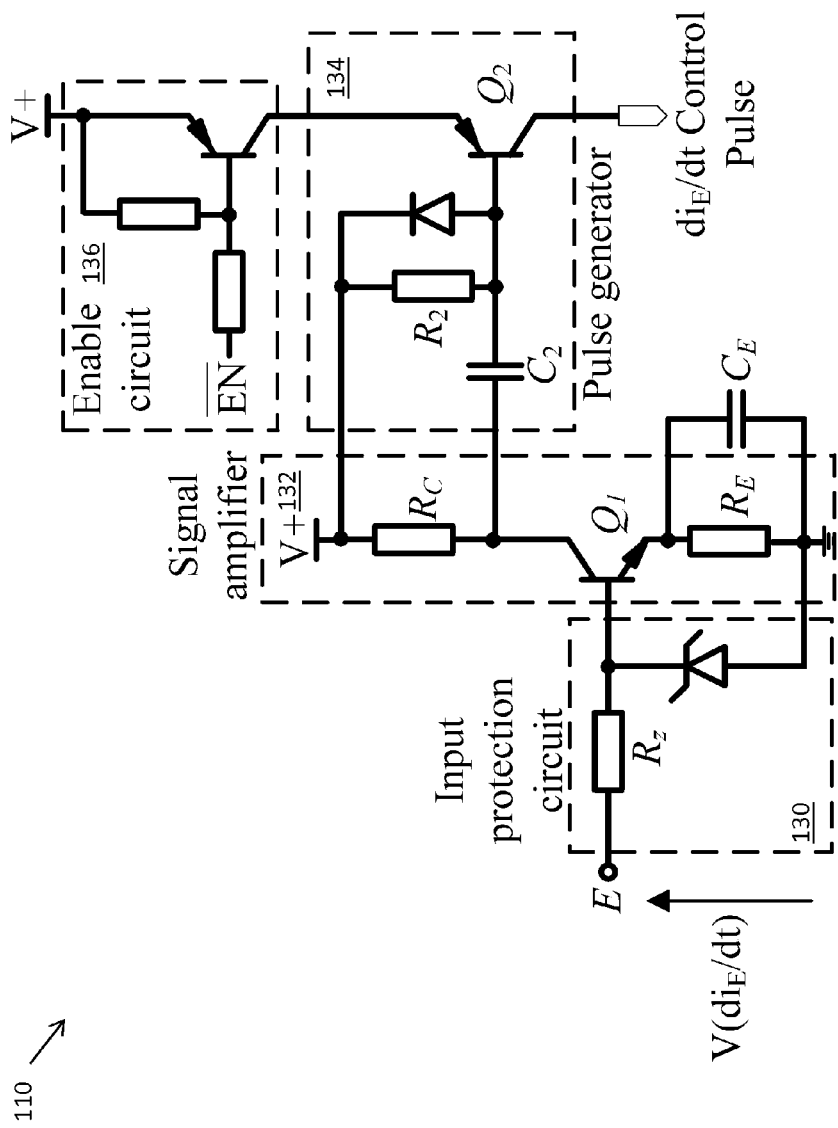
Figure 5C:
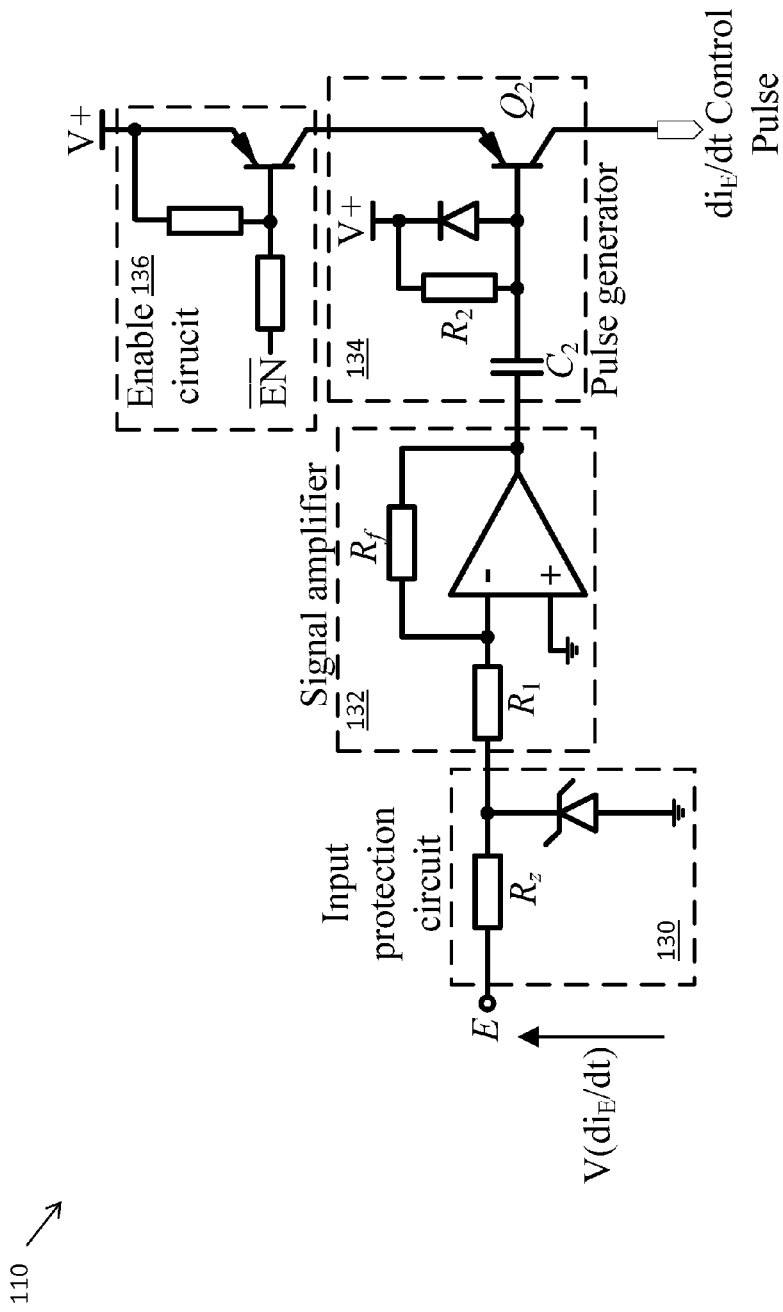

FIGS. 5(a) through 5(c) illustrate analog embodiments of the pulse signal processing circuit 110. The pulse signal processing circuit 110 generates a pulse ($di_E/dt$ control pulse), with optional user-selectable pulse width programmability, immediately when the $V(di_E/dt)$ signal begins to rise. To achieve such synchronization, the pulse signal processing circuit 110 comprises an input protection circuit 130 for clamping against excessively high $V(di_E/dt)$ voltage during short circuit turn-off, before sending the $V(di_E/dt)$ signal to a subsequent signal amplifier 132. The signal amplifier 132 has sufficient gain to cover the desired IGBT operation current range, e.g. (0.1-2.0)×$I_{CNOM}$, to yield an output voltage with large amplitude, possibly by operation in saturation, and fast falling/rising edge when the $V(di_E/dt)$ signal begins to rise. The voltage output by the signal amplifier 132 triggers the subsequent pulse generator 134. The pulse generator 134, which is triggered by the falling/rising edge of the preceding signal amplifier output, generates a positive pull-up $di_E/dt$ control pulse. The width of the positive pull-up $di_E/dt$ control pulse can be set by an RC circuit formed by capacitor $C_2$ and resistor $R_2$.

The $di_E/dt$ control pulse is combined with and superimposed onto the IGBT gate drive signal by the signal combination circuit 112. The combined signal is sent to an output buffer 114 for driving the IGBT gate, by applying a $V_{GE}$ pulse ($di_E/dt$ control) to the IGBT gate which turns on the IGBT 102 for a short duration when $I_E/I_C$ is falling. Depending on the output impedance characteristics of the gate drive signal, the $di_E/dt$ control pulse can be combined with the gate drive signal by direct connection, by a resistor network, or by a logic gate. The pulse signal processing circuit 110 also includes an enable circuit 136 for controlling the generation of the $di_E/dt$ control pulse in response to an enable signal (EN).

Figure 6:
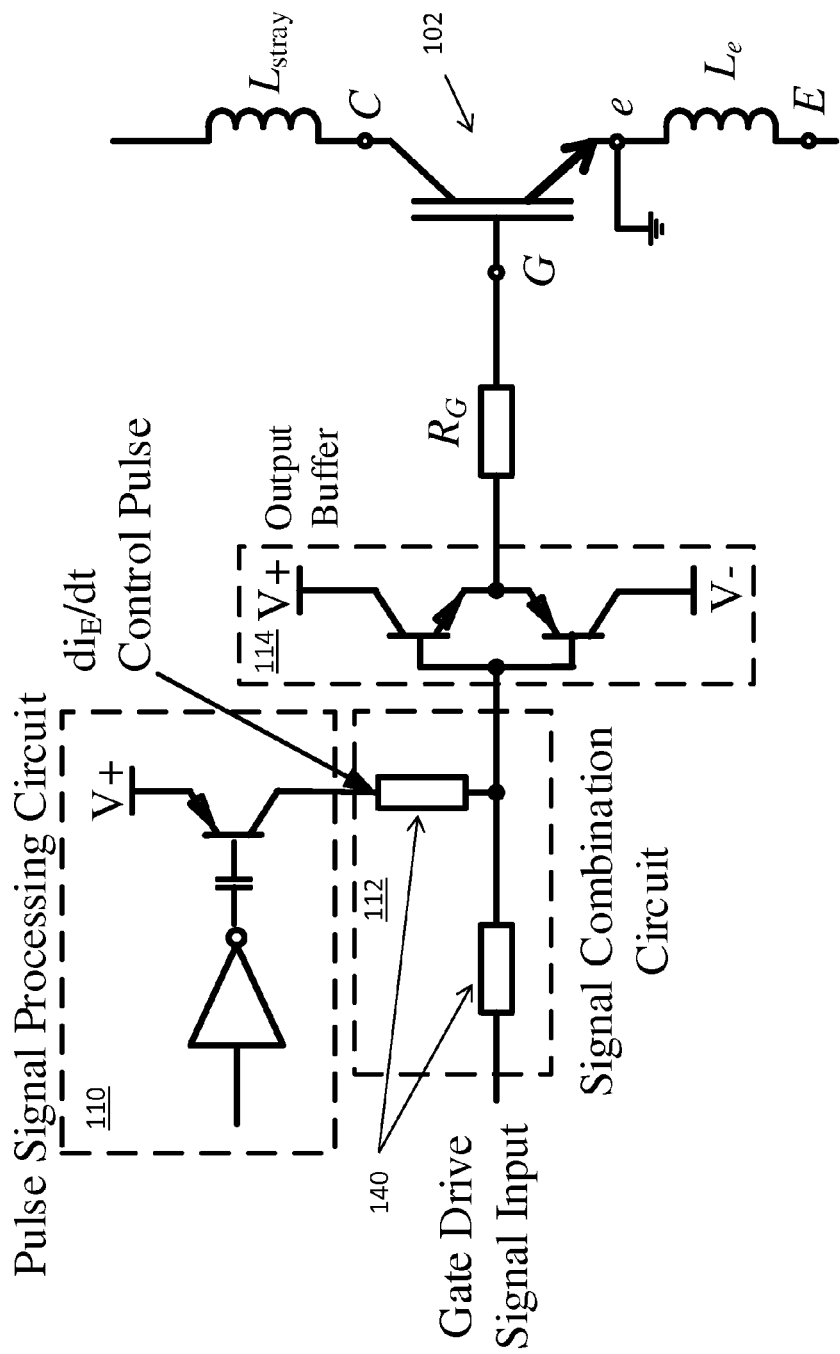
FIG. 6 illustrates a schematic of an embodiment of a circuit for combining a control pulse with a gate drive signal of an IGBT for reducing $V_{CE}$ overshoot of the IGBT.

FIG. 6 illustrates an embodiment of the pulse signal processing circuit 110, the signal combination circuit 112 and the output buffer stage 114. According to this embodiment, the $di_E/dt$ control pulse from the pulse signal processing circuit 110 is combined with the gate drive signal, by a resistor network 140 which implements the signal combining function. The combined signal is then buffered by the output buffer stage 114 and sent to drive the IGBT gate.

Figure 7:
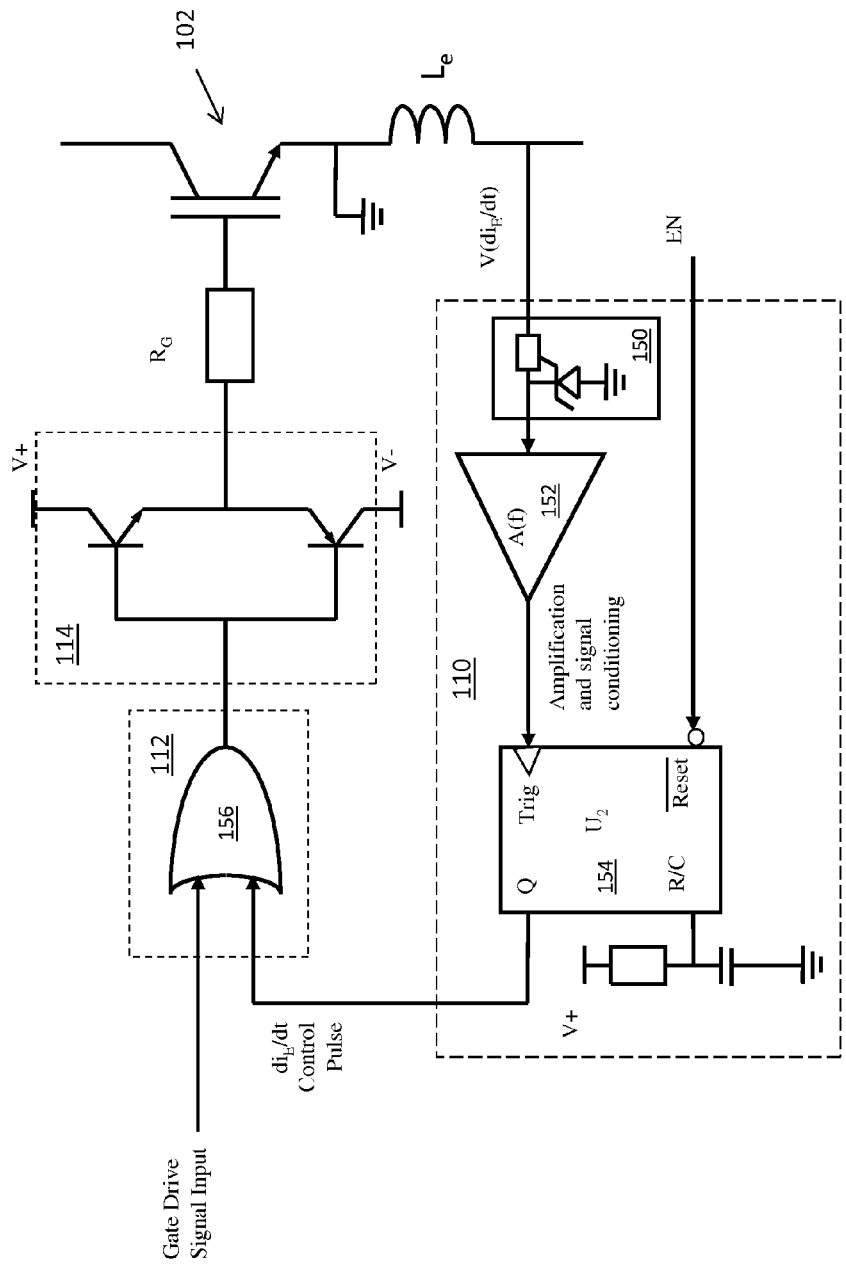
FIG. 7 illustrates a schematic of a digital embodiment of signal processing and signal combination circuitry used in reducing $V_{CE}$ overshoot of an IGBT.
Figure 8:
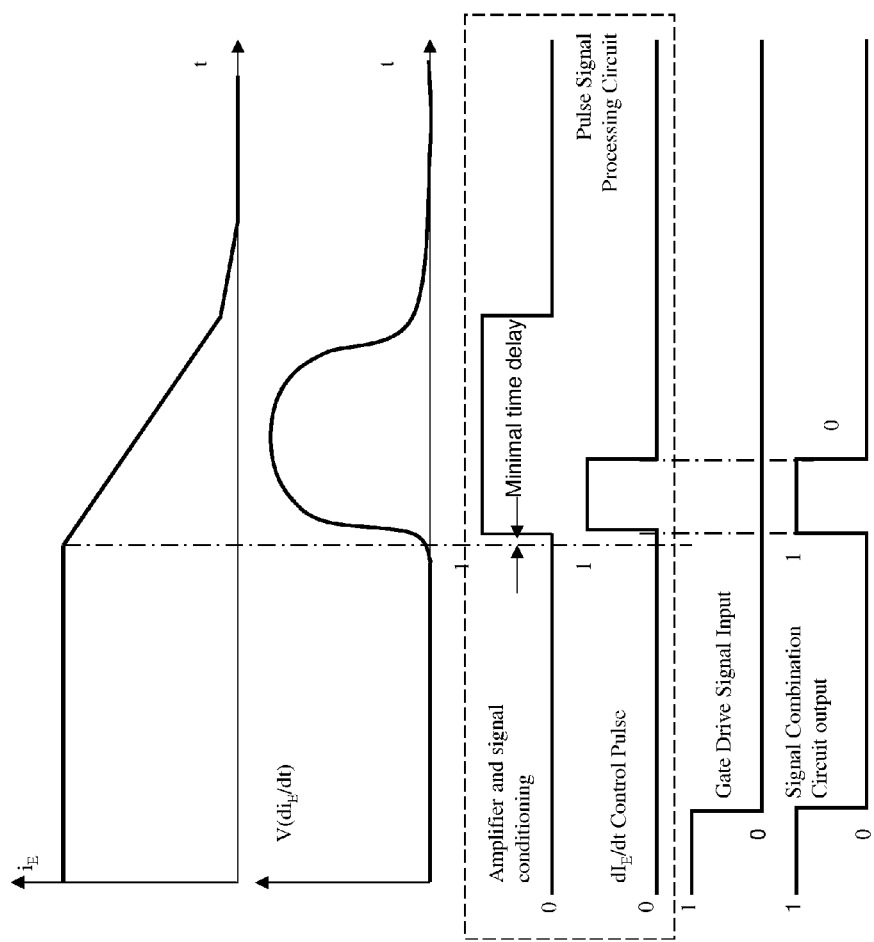
FIG. 8 illustrates a timing diagram associated with the operation of the digital circuitry shown in FIG. 7.

FIG. 7 illustrates a digital embodiment of the pulse signal processing circuit 110 and the signal combination circuit 112. FIG. 8 shows the corresponding timing diagram. According to this embodiment, the pulse signal processing circuit 110 comprises an input protection circuit 150, a signal amplifier 152 and a pulse generator 154. The signal amplifier 152 has adjustable gain A(f) and its frequency characteristic is used for signal conditioning of the $V(di_E/dt)$ signal input. With suitable input signal dynamic range, a logic gate buffer can be used in place of the signal amplifier 152. The output of the amplifier or gate buffer 152 is used as the trigger signal to a monostable multi-vibrator 154, to generate the $di_E/dt$ control pulse output with a fixed logic-level amplitude and user-controllable pulse width (duration). Since the pulse duration (width) of the $di_E/dt$ control pulse is shorter than the $V_{CE}$ overshoot period, the monostable multi-vibrator 154 is edge-triggered instead of level-triggered. The reset function (RESET) of the monostable multi-vibrator 154 can be used to implement the enable function so as to selectively enable or disable the generation of the $di_E/dt$ control pulse in response to the enable control signal (EN). Alternatively, a digital counter can be used to give a pulse upon being triggered. In yet another embodiment, an embedded microcontroller (MCU) inside a digital gate driver board can be triggered by the output of signal amplifier 152. The MCU runs program code to generate a short gate drive output pulse to turn on the output buffer 114. In such an arrangement, the MCU performs the function of the monostable multivibrator 154 and the signal combination circuit 156 by software without requiring additional hardware.

The $di_E/dt$ control pulse is combined with the gate drive signal by a logic gate 156 which implements the signal combining function. Such a logic gate 156 can be implemented as an OR gate for positive logic signals or an AND for negative logic signals.

Due to circuit simplicity, the combined functions of the pulse signal processing circuit 110 and the signal combination circuit 112 shown in FIG. 7 can also be implemented in a driver IC (integrated circuit) or by a microcontroller as an additional feature on top of its existing functionality, e.g. in a digital IGBT gate driver board which has such a microcontroller.

During IGBT short-circuit into low impedance (short-circuit type I), $i_E/i_C$ rises rapidly to a very high value typically six times the nominal collector current $I_{CNOM}$. Normally, the IGBT short-circuit protection function in the gate driver board monitors the $V_{CE}$ voltage to check for desaturation and acknowledges the status of a short-circuit fault condition when $V_{CE}$ rises to a defined value of e.g. some tens of volts into the desaturation region. The IGBT gate voltage can then be slowly reduced when the short-circuit fault is acknowledged with soft turn-off or two-level turn-off techniques, and after a short moment e.g. 5 μs the IGBT is turned-off. Due to high short-circuit current $I_C$ prior to turn-off, $V_{CE}$ voltage overshoot may reach a dangerous level after turn-off if unmitigated. Active clamping techniques are often employed for overvoltage protection to clamp the $V_{CE}$ to a defined maximum value. With some modifications, the $V_{CE}$ overshoot control techniques previously described herein can be extended to provide overvoltage protection during short-circuit turn-off.

The operation principle for short-circuit turn-off overvoltage protection is the same as for the overshoot control previously described herein, in that the pulse signal processing circuit 110 generates a $di_E/dt$ control pulse immediately upon short-circuit turn-off. Due to much higher current during short-circuit turn-off, the width of the $di_E/dt$ control pulse for short-circuit overvoltage protection is longer than needed for normal operation. Using such a long $di_E/dt$ control pulse leads to unnecessarily high turn-off loss $E_{OFF}$ during normal operation. Therefore, the pulse signal processing circuit 110 generates a short-circuit (SC) $di_E/dt$ control pulse with longer pulse width when enabled by a signal SC that acknowledge the status of a short-circuit fault condition, e.g. from the short-circuit detection function in the gate driver board.

With this SC $di_E/dt$ control pulse approach, the SC $di_E/dt$ control pulse turns on the IGBT 102 earlier at a lower $V_{CE}$ overvoltage during $V_{CE}$ overshoot, and thus is safer than conventional active clamping approaches which implement IGBT turn-on at a later stage and at a higher overvoltage. In addition, conventional active clamping approaches prevent $V_{CE}$ overshoot beyond the intended clamping voltage level by turning on the IGBT immediately when the $V_{CE}$ overshoot reaches the Zener clamping voltage, by passing high pulse current to turn on the IGBT gate through the active clamping Zener diodes. This current pulse results in high instantaneous power dissipation in the active clamping Zener diodes, and results in high continuous power dissipation in situations such as DC link overvoltage and repetitive overload or short-circuit. The Zener diodes in the active clamping circuit risk overpower failure if not dimensioned carefully. On the other hand, the $di_E/dt$ control pulse approach described herein is a signal control approach which does not involve any power dissipation of its own. Also, no feedback is needed from the high-voltage collector (C) to the low-voltage gate (G) for the $di_E/dt$ control pulse approach.

Figure 9A:
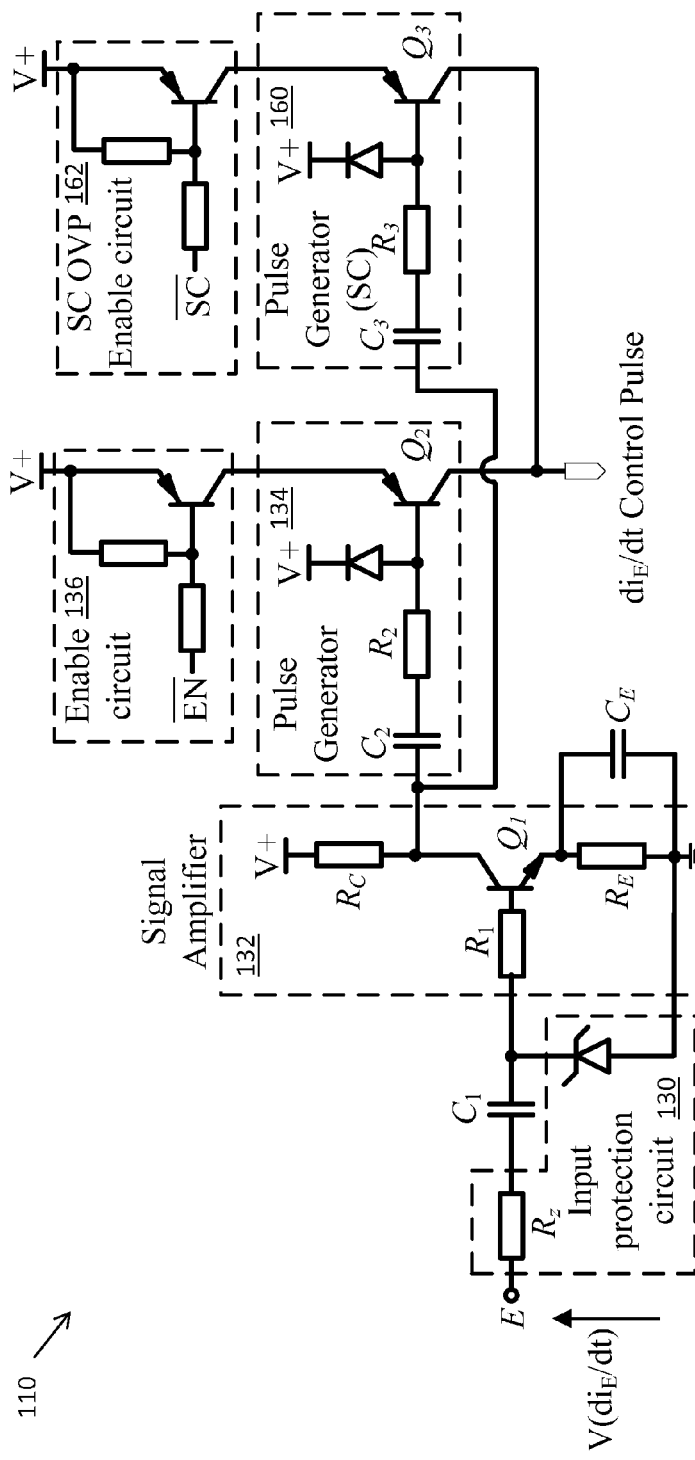
FIGS. 9(a) through 9(c) illustrate schematics of different analog embodiments of a pulse signal processing circuit modified with short-circuit turn-off overvoltage protection.
Figure 9B:
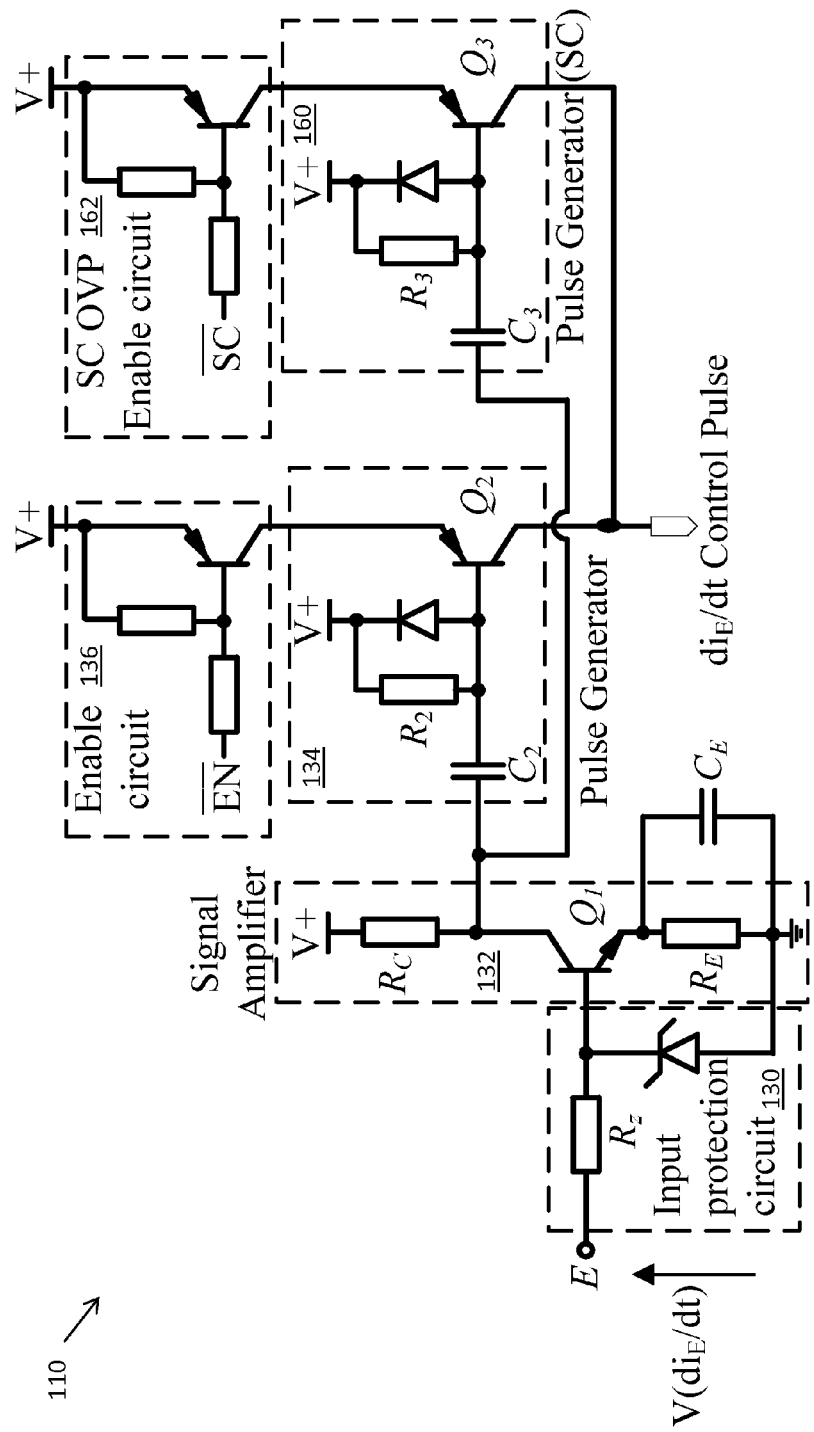
Figure 9C:
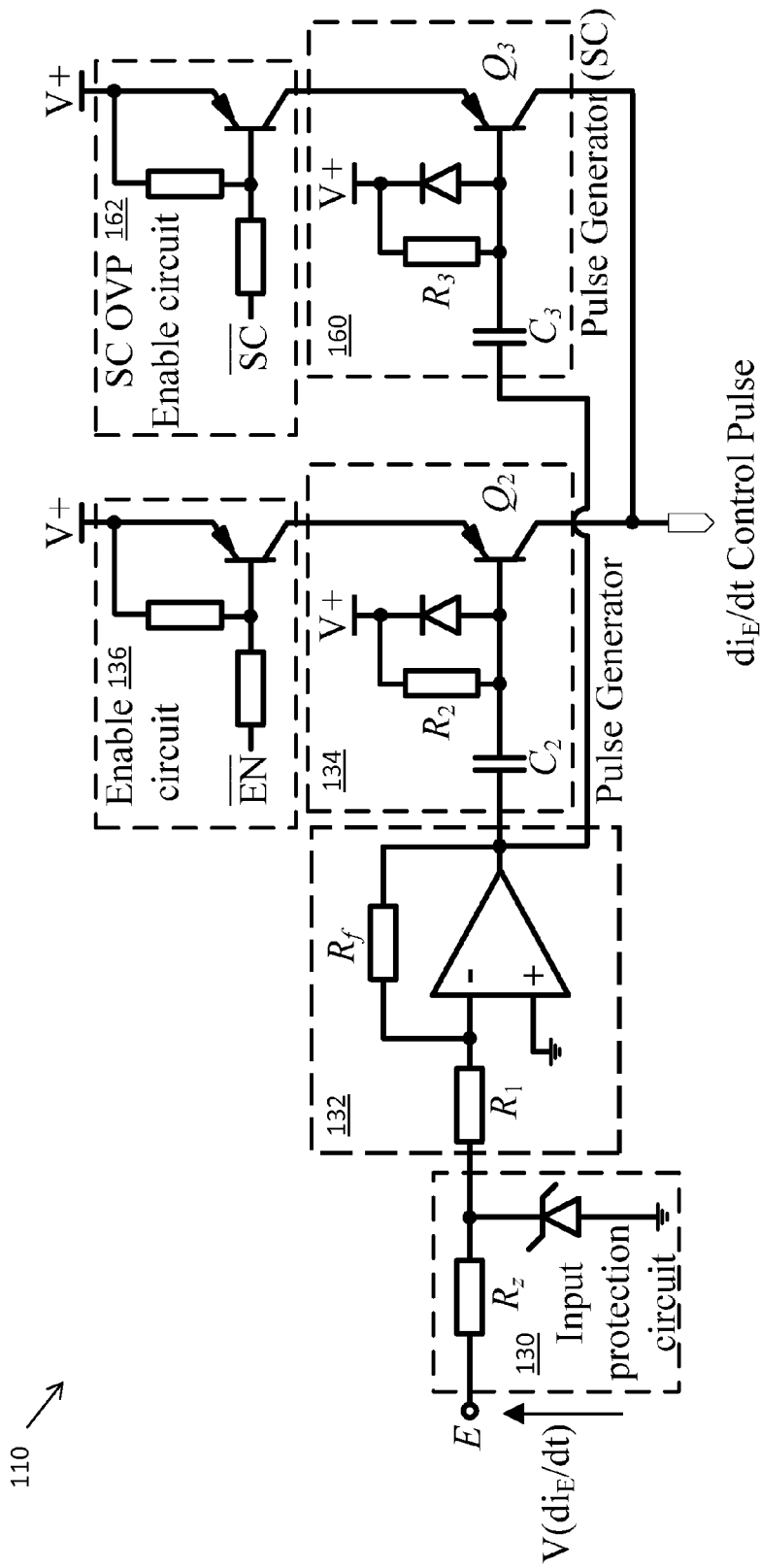

FIGS. 9(a) through 9(c) illustrate the respective pulse signal processing circuit embodiments shown in FIGS. 5(a) through 5(c), modified to generate a synchronized $di_E/dt$ control pulse from the $V(di_E/dt)$ signal with additional short-circuit turn-off overvoltage protection. Compared with the respective functions shown in FIGS. 5(a) through 5(c), a short-circuit (SC) pulse generator 160 is provided to generate a SC $di_E/dt$ control pulse having a width longer than the $di_E/dt$ control pulse generated by the main pulse generator 134 for overshoot reduction during normal operation. The SC pulse generator 160 is controlled by a SC OVP (overvoltage protection) enable circuit 162. The SC pulse generator 160 is triggered by the same signal amplifier 132 as the main $di_E/dt$ control pulse generator 134, but only generates the SC $di_E/dt$ control pulse when enabled by the SC OVP enable circuit 162, e.g. when short-circuit is detected by the short-circuit detection function in the gate driver board. The SC pulse generator 160 is disabled by the SC OVP enable circuit 162 during normal operation of the IGBT 102. The outputs of both pulse generators 134, 160 are combined to form a single $di_E/dt$ control pulse which is combined with the IGBT gate drive signal as previously described herein. As such, the width of the combined pulse signal is increased in response to a signal (SC) which indicates a short-circuit fault condition such that the resulting pulse width is narrower for normal operation and wider for short-circuit operation.

Figure 10:
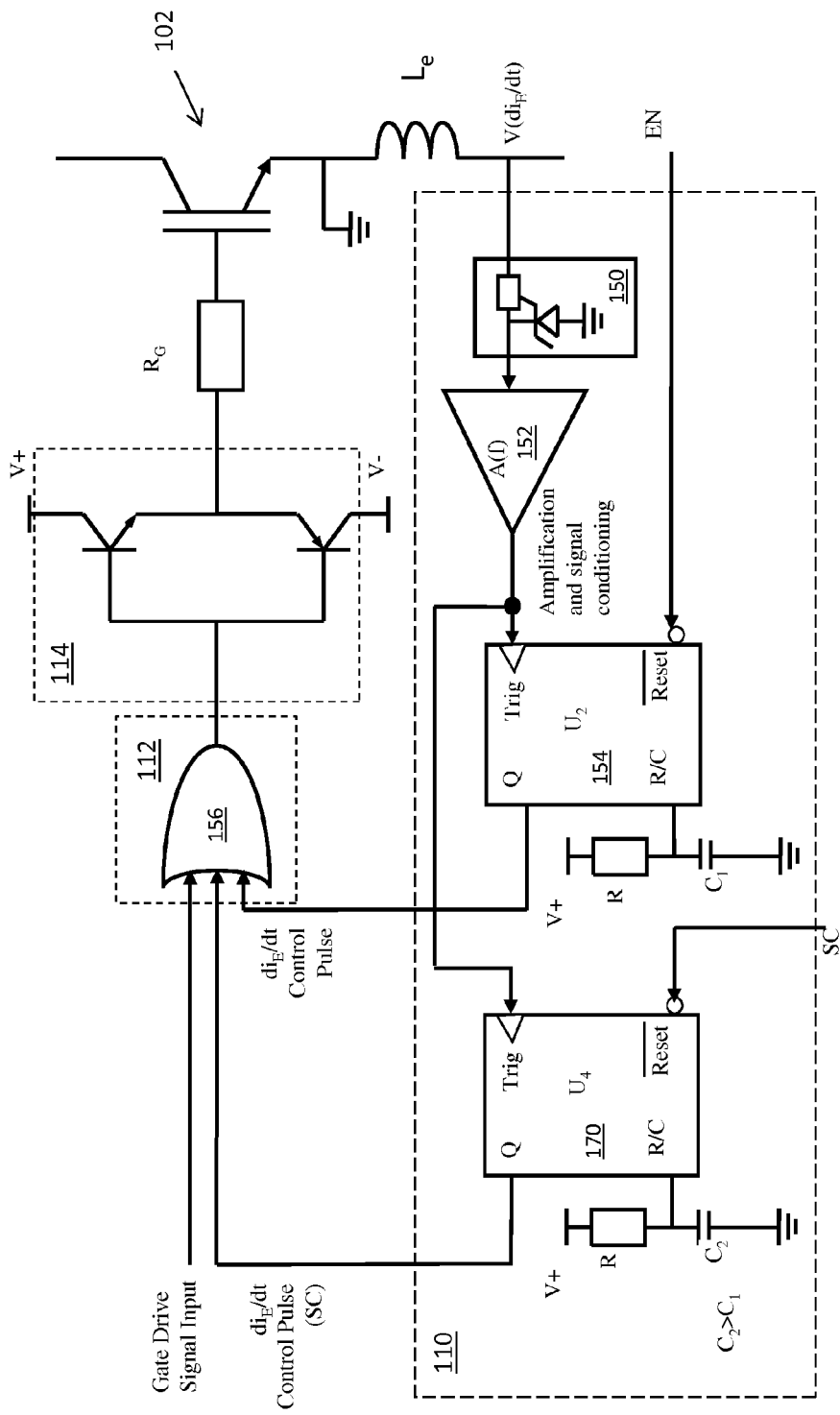
FIG. 10 illustrates a schematic of a digital embodiment of pulse signal processing and signal combination circuitry for providing short-circuit turn-off overvoltage protection.
Figure 11:
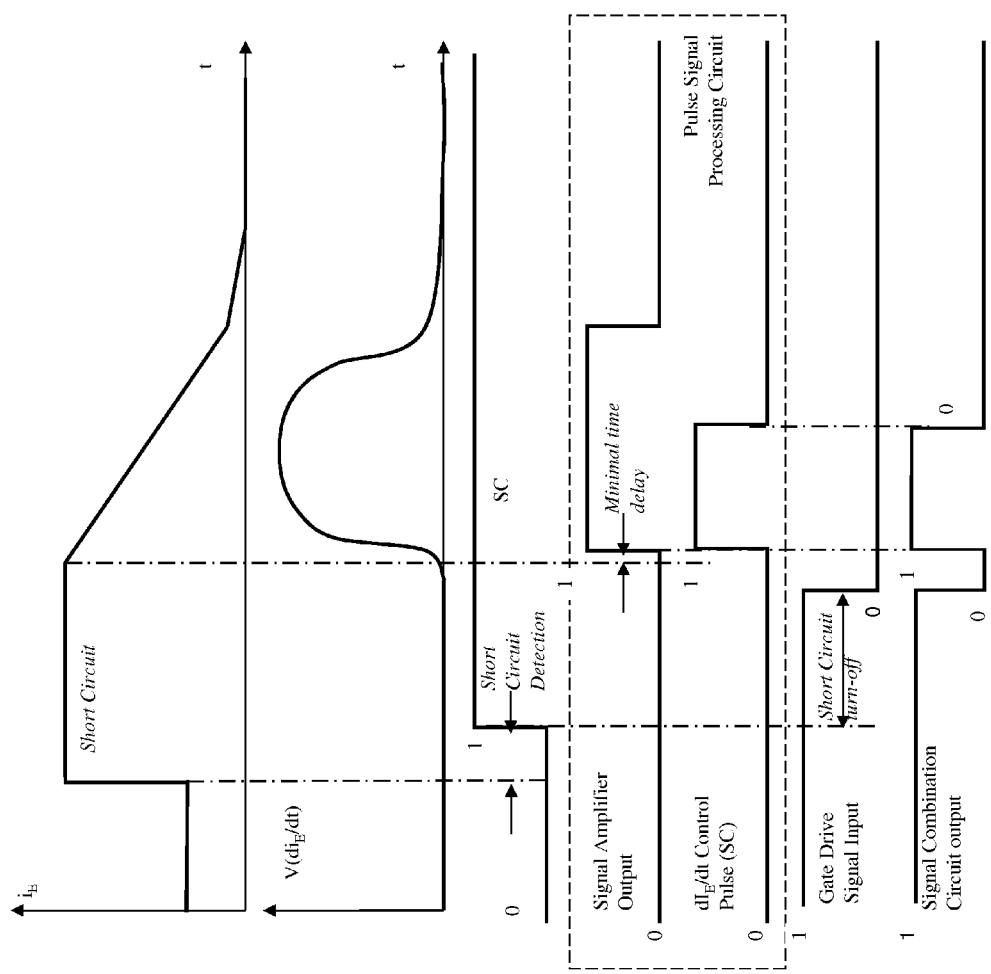
FIG. 11 illustrates a timing diagram associated with the operation of the digital circuitry shown in FIG. 10.

FIG. 10 illustrates a digital embodiment of the pulse signal processing circuit 110, the signal combination circuit 112 and the output buffer stage 114, implemented with short-circuit turn-off overvoltage protection function. FIG. 11 shows the corresponding timing diagram. Compared to FIG. 7, there is an extra monostable multi-vibrator (U4) 170 which functions as a SC pulse generator for generating the SC $di_E/dt$ control pulse. The SC pulse generator 170 is triggered by the same signal amplifier 152 as the main pulse generator 154 and enabled by the SC signal e.g. from the gate driver board short-circuit detection function. When a short-circuit condition is detected, the SC signal is set to a logic high state and the SC pulse generator 170 is enabled. When the IGBT 102 is turned off after short-circuit, falling $I_E$ gives a $V(dI_E/dt)$ signal to trigger the SC monostable multi-vibrator 170, which in turn generates a SC $di_E/dt$ control pulse having a pulse width longer than the normal $di_E/dt$ control pulse generated by the main pulse generator 154. The output of the SC monostable multi-vibrator 170 is sent to the signal combination circuit 156 to logically add with the gate drive signal and the $di_E/dt$ control pulse generated by the main pulse generator 154, and sent to the output buffer stage 114 for driving the gate of the IGBT 102.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:
an insulated gate bipolar transistor (IGBT) operable to conduct current in a first phase of a switching cycle and block current in a second phase of the switching cycle responsive to a control signal applied to the gate of the IGBT, wherein overshoot occurs in the collector-emitter voltage ($V_{CE}$) of the IGBT in the second phase of the switching cycle; and
circuitry operable to:
generate a pulse which has a rising edge synchronized to the moment when current through the IGBT begins to fall in the second phase of the switching cycle and a width which is a fraction of a duration of the $V_{CE}$ overshoot; and
combine the pulse with the control signal applied to a gate of the IGBT so as to momentarily raise the gate voltage of the IGBT in the second phase of the switching cycle to above a threshold voltage of the IGBT for the duration of the pulse.

2. The circuit of claim 1, wherein the IGBT is a trench-gate IGBT.

3. The circuit of claim 1, wherein the pulse has a fixed amplitude.

4. The circuit of claim 1, wherein the width of the pulse is fixed.

5. The circuit of claim 1, wherein the width of the pulse is a function of an intrinsic turn-off fall time of the IGBT.

6. The circuit of claim 1, wherein the width of the pulse is between ½ and ¼ the duration of the $V_{CE}$ overshoot.

7. The circuit of claim 1, wherein the circuitry comprises:
a first circuit operable to sense collector or emitter current of the IGBT;
a second circuit operable to output a signal which represents the time-differentiation of the sensed collector or emitter current;
a third circuit operable to generate the pulse responsive to the signal output by the second circuit; and
a fourth circuit operable to combine the pulse and the control signal.

8. The circuit of claim 7, wherein the third circuit has user-controllable amplitude gain and time constant variables for adjusting the amplitude and time duration of the pulse.

9. The circuit of claim 7, wherein the third circuit is operable to adjust the width of the pulse responsive to a user input signal.

10. The circuit of claim 7, wherein the fourth circuit is operable to pass the control signal uncombined with the pulse to the IGBT responsive to a pulse enable signal being deactivate.

11. The circuit of claim 7, wherein the first circuit is operable to sense the collector or emitter current of the IGBT by sensing current through one of stray emitter inductance at an emitter terminal of the IGBT or a shunt resistor connected to the emitter terminal, and wherein the second circuit is operable to output the signal which represents the time-differentiation of the sensed collector or emitter current output based on one of the voltage across the stray emitter inductance, the voltage across the shunt resistor, a voltage induced at a Rogoswki coil magnetically coupled to the emitter terminal, or a voltage induced at a current transformer coil magnetically coupled to the emitter terminal.

12. The circuit of claim 11, wherein the third circuit is operable to generate the pulse at the moment when the voltage measured by the second circuit begins to rise in the second phase of the switching cycle.

13. The circuit of claim 11, wherein the third circuit comprises:
a protection circuit operable to clamp the output of the second circuit against excessively high voltage during short circuit turn-off;
a signal amplifier operable to amplify the protection circuit output; and
a first pulse generator operable to trigger responsive to a falling/rising edge of the signal amplifier output.

14. The circuit of claim 13, wherein the third circuit further comprises a second pulse generator triggered by the same signal amplifier as the first pulse generator and operable to generate an additional pulse having a longer width than the pulse generated by the first pulse generator, and wherein the second pulse generator is enabled during short-circuit protection of the IGBT and disabled during normal operation of the IGBT.

15. The circuit of claim 14, wherein the fourth circuit is operable to combine the pulses output by the first and the second pulse generators and the control signal.

16. The circuit of claim 14, wherein the first and the second pulse generators each comprise a monostable multivibrator.

17. The circuit of claim 7, wherein the third circuit has an input signal range which ranges from 0.1 to 2.0 times a nominal collector current of the IGBT during normal operation of the IGBT and ranges from 0.1 to 6.0 times the nominal collector current during short-circuit protection of the IGBT.

18. The circuit of claim 1, wherein the circuitry is configured to disable generation of the pulse responsive to a command signal indicating the pulse is to be disabled.

19. The circuit of claim 1, wherein the circuitry is configured to increase the width of the pulse in response to a signal which indicates a short-circuit fault condition such that the pulse width is narrower for normal operation and wider for short-circuit operation.

20. A method of reducing overshoot for an insulated gate bipolar transistor (IGBT) operable to conduct current in a first phase of a switching cycle and block current in a second phase of the switching cycle responsive to a control signal applied to the gate of the IGBT, the overshoot occurring in the collector-emitter voltage ($V_{CE}$) of the IGBT in the second phase of the switching cycle, the method comprising:

generating a pulse which has a rising edge synchronized to the moment when current through the IGBT begins to fall in the second phase of the switching cycle and a width which is a fraction of a duration of the $V_{CE}$ overshoot; and combining the pulse with the control signal applied to a gate of the IGBT so as to momentarily raise the gate voltage of the IGBT in the second phase of the switching cycle to above a threshold voltage of the IGBT for the duration of the pulse.

21. A circuit for reducing collector-emitter voltage ($V_{CE}$) overshoot in an insulated gate bipolar transistor (IGBT), the circuit comprising circuitry operable to:

generate a pulse which has a rising edge synchronized to the moment when collector or emitter current of the IGBT begins to fall during turn-off of the IGBT and a width which is a fraction of a duration of the $V_{CE}$ overshoot; and combine the pulse with a control signal applied to a gate of the IGBT so as to momentarily raise the gate voltage of the IGBT during turn-off of the IGBT to above a threshold voltage of the IGBT for the duration of the pulse.

* * * * *